US 7,495,596 B2

(12) United States Patent
Kim et al.

(10) Patent No.: US 7,495,596 B2
(45) Date of Patent: Feb. 24, 2009

(54) MULTI-CHANNEL PIPELINED SIGNAL CONVERTER

(75) Inventors: Suhwan Kim, Seoul (KR); Jong-Kwan Woo, Seoul (KR); Han Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/804,808

(22) Filed: May 21, 2007

(65) Prior Publication Data

US 2008/0055127 A1 Mar. 6, 2008

(30) Foreign Application Priority Data

Aug. 31, 2006 (KR) ........................ 10-2006-0083209

(51) Int. Cl.
*H03M 1/38* (2006.01)
(52) U.S. Cl. ..................... 341/161; 341/118; 341/120; 341/155; 341/162; 341/163
(58) Field of Classification Search ......... 341/118–122, 341/155, 161, 162, 163
See application file for complete search history.

(56) References Cited

U.S. PATENT DOCUMENTS

| | | | | |
|---|---|---|---|---|
| 6,133,864 A * | 10/2000 | Sabatini | ................... | 341/141 |
| 6,340,944 B1 * | 1/2002 | Chang et al. | ................ | 341/161 |
| 6,628,216 B2 * | 9/2003 | Chen et al. | .................. | 341/120 |
| 6,825,783 B2 | 11/2004 | You | ........................ | 341/118 |
| 6,870,495 B1 * | 3/2005 | Zadeh et al. | ................. | 341/161 |
| 7,023,373 B2 * | 4/2006 | da Fonte Dias | ............ | 341/162 |
| 7,148,833 B1 * | 12/2006 | Cho et al. | ................... | 341/162 |
| 7,236,118 B2 * | 6/2007 | Kurose et al. | ............... | 341/161 |
| 7,250,895 B2 * | 7/2007 | Kurose et al. | ............... | 341/155 |
| 2006/0033652 A1 * | 2/2006 | Nakamori et al. | ........... | 341/155 |
| 2006/0049973 A1 | 3/2006 | Dosho et al. | | |
| 2006/0109154 A1 * | 5/2006 | Lee et al. | .................... | 341/144 |
| 2006/0114143 A1 * | 6/2006 | Dias | ........................ | 341/155 |

OTHER PUBLICATIONS

Japanese Patent Application No. 11-359002 to Kazuhiro, having Publication date of Jun. 29, 2001 (w/ English Abstract page).
Korean Patent Application No. 1020020062844 to Yoo, having Publication date of Apr. 28, 2004 (w/ English Abstract page).
Japanese Patent Application No. 2003-348744 to You, having Publication date of May 13, 2004 (w/ English Abstract page).
Japanese Patent Application No. 2004-116300 to Watanabe, having Publication date of Oct. 27, 2005 (w/ English Abstract page).
Japanese Patent Application No. 2004-260504 to Michimasa, having Publication date of Mar. 23, 2006 (w/ English Abstract page).

* cited by examiner

*Primary Examiner*—Linh V Nguyen
(74) *Attorney, Agent, or Firm*—Monica H. Choi (57) ABSTRACT

A signal converter such as a multi-channel pipelined signal converter includes a plurality of pipelined signal converters and a decision unit. Each of the pipelined signal converters has a respective plurality of stage cells coupled in series with switched coupling between the pipelined signal converters. The decision unit determines a respective selected path through the stage cells of the plurality of pipelined signal converters for each of a plurality of input signals during a signal path selection mode.

17 Claims, 7 Drawing Sheets

MULTI-CHANNEL PIPELINED SIGNAL CONVERTER

BACKGROUND OF THE INVENTION

This application claims priority under 35 USC § 119 to Korean Patent Application No. 2006-83209, filed on Aug. 31, 2006 in the Korean Intellectual Property Office, the disclosure of which is incorporated herein in its entirety by reference.

1. Field of the Invention

The present invention relates generally to signal converters, and more particularly to a multi-channel pipelined signal converter such as for analog to digital signal conversion, that determines high performance signal paths.

2. Background of the Invention

Various digital signal processing systems require data conversion of analog data signals to digital data signals for digital signal processing. An analog to digital converter (ADC) is used for such data conversion. As an embodiment of the ADCs, a pipelined ADC is frequently used. A multi-channel pipelined ADC including a plurality of pipelined ADCs is also used. However, the multi-channel pipelined ADC may exhibit different performance among the pipelined ADCs with variation of manufacturing process, voltage, or temperature.

SUMMARY OF THE INVENTION

Accordingly, a multi-channel pipelined signal converter of the present invention selects signals paths to ensure performance despite variation of manufacturing process, voltage, and/or temperature.

A signal converter such as a multi-channel pipelined signal converter according to an aspect of the present invention includes a plurality of pipelined signal converters and a decision unit. Each of the pipelined signal converters has a respective plurality of stage cells coupled in series. The decision unit determines a respective selected path through the stage cells of the plurality of pipelined signal converters for each of a plurality of input signals during a signal path selection mode.

In an embodiment of the present invention, each of the pipelined signal converters includes a respective input selection unit controlled by the decision unit to output a test signal during the signal path selection mode and to output a respective input signal during a normal operation mode, to first stage cells of the pipelined signal converters. Additionally, each of the pipelined signal converters further includes a respective sample and hold unit for sampling a respective output of the respective input selection unit to generate a respective sampled input signal to the first stage cells of the pipelined signal converters.

In another embodiment of the present invention, each of the stage cells includes a respective selection unit and a respective stage. The respective selection unit is controlled by the decision unit to output a selected one of a plurality of outputs from a previous stage of the pipelined signal converters. The respective stage generates a respective digital signal and a respective analog signal from the output of the respective stage selection unit.

In a further embodiment of the present invention, the decision unit controls the respective selection units for setting the respective selected path for each of the input signals during a normal operation mode after the signal path selection mode.

In another embodiment of the present invention, a respective last stage includes a respective flash analog-to-digital converter for each of the plurality of pipelined signal converters.

In a further embodiment of the present invention, the signal converter also includes a selection signal generation unit for generating control signals to the respective selection units.

In another embodiment of the present invention, the signal converter further includes a digital correction unit for generating a respective converted output signal from the respective digital signals and at least one of the respective analog signals in the respective selected path for each of the plurality of input signals.

In an example embodiment of the present invention, the decision unit includes a data processor and a memory device having sequences of instructions stored thereon. Execution of the sequences of instructions by the data processor causes the data processor to perform the step of analyzing performance characteristics of a respective converted output signal for each of a respective plurality of possible signal paths for determining the respective selected path of each input signal.

A signal converter according to another aspect of the present invention includes a plurality of pipelined signal converters and a selection signal generation unit. Each of the plurality of pipelined signal converters has a respective plurality of stage cells coupled in series, with each stage cell having a respective selection unit and a respective stage. The selection signal generation unit generates control signals that control the respective selection units for defining a respective selected path through the respective stages in the plurality of pipelined signal converters for each of a plurality of input signals.

In this manner, the respective path for each input signal is selected for desired performance characteristics despite variation of manufacturing process, voltage, and/or temperature.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1:
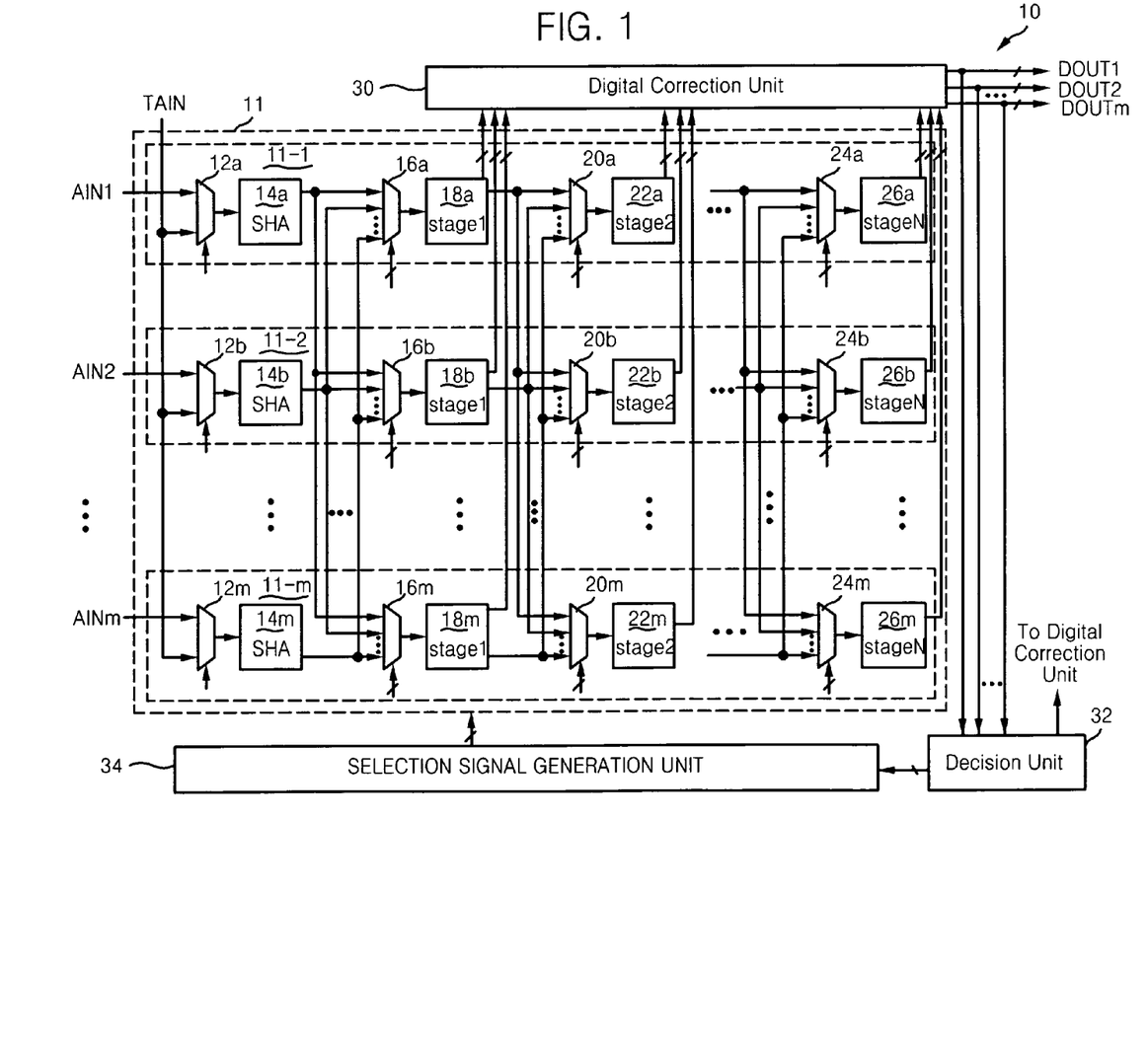
FIG. 1 shows a block diagram of a multi-channel pipelined analog to digital converter according to an embodiment of the present invention.

FIG. 1 shows a block diagram of a multi-channel pipelined analog to digital converter (ADC) 10 according to an embodiment of the present invention. Referring to FIG. 1, the multi-channel pipelined ADC 10 includes a plurality such as m pipelined ADCs 11-1, 11-2, . . . , and 11-m, a digital correction unit 30, a decision unit 32, and a selection signal generation unit 34. Here, m is a natural number.

The plurality of pipelined ADCs 11-1, 11-2, . . . , and 11-m are formed in a core 11 of a semiconductor integrated circuit device in one embodiment of the present invention. The plurality of pipelined ADCs 11-1, 11-2, . . . , and 11-m are also each referred to as a channel.

Components and operation of an example pipelined ADC 11-1 is now described. The pipelined ADC 11-1 includes an input selection unit 12a, a sample/hold amplifier unit 14a, and n pipeline stage cells connected in series (or cascade) after the sample/hold amplifier unit 14a, where n is a natural number.

Each of the n pipeline stage cells includes a respective selection unit and a respective pipeline stage. That is, a first pipeline stage cell includes a first selection unit 16a and a first pipeline stage 18a, a second pipeline stage cell includes a second selection unit 20a and a second pipeline stage 22a, and so on with an n-th pipeline stage cell including an n-th selection unit 24a and an n-th pipeline stage 26a.

The input selection unit 12a is controlled by selection control signals from the selection signal generation unit 34 to output one of an analog input signal AIN1 or a test signal TAIN to the sample/hold amplifier 14a. The decision unit 32 controls the selection signal generation unit 34 to generate such selection control signals.

For example, during a signal path selection mode, the input selection unit 12a is controlled to output the test signal TAIN to the sample/hold amplifier 14a. Alternatively, during a normal operation mode after the signal path selection mode, the input selection circuit 12a is controlled to output the analog input signal AIN1 to the sample/hold amplifier 14a. The input selection circuit 12a is embodied as a multiplexer in an example embodiment of the present invention, but it is not restricted thereto. The sample/hold amplifier unit 14a samples the output signal TAIN or AIN1 from the input selection circuit 12a, amplifies the sampled signal, and holds the amplified signal.

The first selection unit 16a receives a respective amplified analog signal output from each of the sample/hold amplifiers 14a, 14b, . . . , and 14m in the m ADCs 11-1, 11-2, . . . , and 11-m. The first selection unit 16a is controlled by selection control signals from the selection signal generation unit 34 to output a selected one of such m analog signals to the first pipeline stage 18a.

The first pipeline stage 18a generates a first analog signal and a first digital signal from the selected analog signal provided by the first selection unit 16a. The digital signal from the first pipeline stage 18a is provided to the digital correction unit 30. The analog signal from the first pipeline stage 18a is provided to the second selection unit 20a in the subsequent stage cell in the series of stage cells.

The second selection unit 20a receives analog signals output from the first pipeline stages 18a, 18b, . . . , and 18m of the previous stage in the pipelined ADCs 11-1, 11-2, . . . , and 11-m. The second selection unit 20a is controlled by selection control signals from the selection signal generation unit 34 to output a selected one of such m analog signals to the second pipeline stage 22a.

The second pipeline stage 22a generates a second analog signal and a second digital signal from the selected analog signal provided by the second selection unit 20a. The digital signal from the second pipeline stage 22a is provided to the digital correction unit 30. The analog signal from the second pipeline stage 22a is provided to a selection unit in the subsequent stage cell in the series of stage cells.

The cascade of the series of stage cells in the first pipelined ADC 11-1 operates similarly until the n-th selection unit 24a receives analog signals output from the (n−1)-th stages of the previous stage in the pipelined ADCs 11-1, 11-2, . . . , and 11-m. The n-th selection unit 24a is controlled by selection control signals from the selection signal generation unit 34 to output a selected one of such m analog signals to the n-th pipeline stage 26a.

The n-th pipeline stage 26a generates an n-th analog signal and an n-th digital signal from the selected analog signal provided by the n-th selection unit 24a. The digital signal from the n-th pipeline stage 26a is provided to the digital correction unit 30.

The respective sets of selection control signals to the selection units 16a, 20a, and 24a may be same or different from each other. Each of the stages 18a, 22a, and 26a generates a respective digital signal having a same number or a different number of bits to each other. When each of the stages 18a, 22a, and 26a is embodied to include analog amplification, each of the stages 18a, 22a, and 26a may includes a respective buffer for generating a respective buffered analog signal from the respective analog signal output from the respective one of the selection units 16a, 20a, and 24a.

Components 12b, 14b, 16b, 18b, 20b, 22b, 24b, and 26b for the second pipelined ADC 11-2 operate similarly as described for the components 12a, 14a, 16a, 18a, 20a, 22a, 24a, and 26a, respectively. Thus, the input selection unit 12b is controlled by selection control signals from the selection signal generation unit 34 to output the test signal TAIN in the signal path selection mode and a respective analog input signal AIN2 in the normal operation mode, to the sample/hold amplifier 14b.

In addition, the selection unit 16b receives the m analog signals from the sample/hold amplifiers 14a, 14b, . . . , and 14m. The selection unit 16b is controlled by selection control signals from the selection signal generation unit 34 to output a selected one of such analog signals to the first pipeline stage 18b that generates a respective analog signal and a respective digital signal.

Similarly, the selection circuit 20b receives analog signals from the pipeline stages 18a, 18b, . . . , and 18m in the previous stage of the pipelined ADCs 11-1, 11-2, . . . , and 11-m. The selection circuit 20b is controlled by selection control signals from the selection signal generation unit 34 to output a selected one of such analog signals to the second pipeline stage 22b that generates a respective analog signal and a respective digital signal.

The cascade of the series of stage cells in the second pipelined ADC 11-2 operates similarly until the n-th selection unit 24b receives analog signals from the (n−1)-th stages of the previous stage in the pipelined ADCs 11-1, 11-2, . . . , and 11-m. The n-th selection unit 24b is controlled by selection control signals from the selection signal generation unit 34 to output a selected one of such m analog signals to the n-th pipeline stage 26b that generates a respective analog signal and a respective digital signal.

Similarly, components 12m, 14m, 16m, 18m, 20m, 22m, 24m, and 26m for the m-th pipelined ADC 11-m operate similarly as described for the components 12a, 14a, 16a, 18a, 20a, 22a, 24a, and 26a, respectively. Thus, digital signals and at least one analog signal generated from the pipeline stages 18m, 22m, ..., and 26m are output to the digital correction unit 30.

Figure 2:
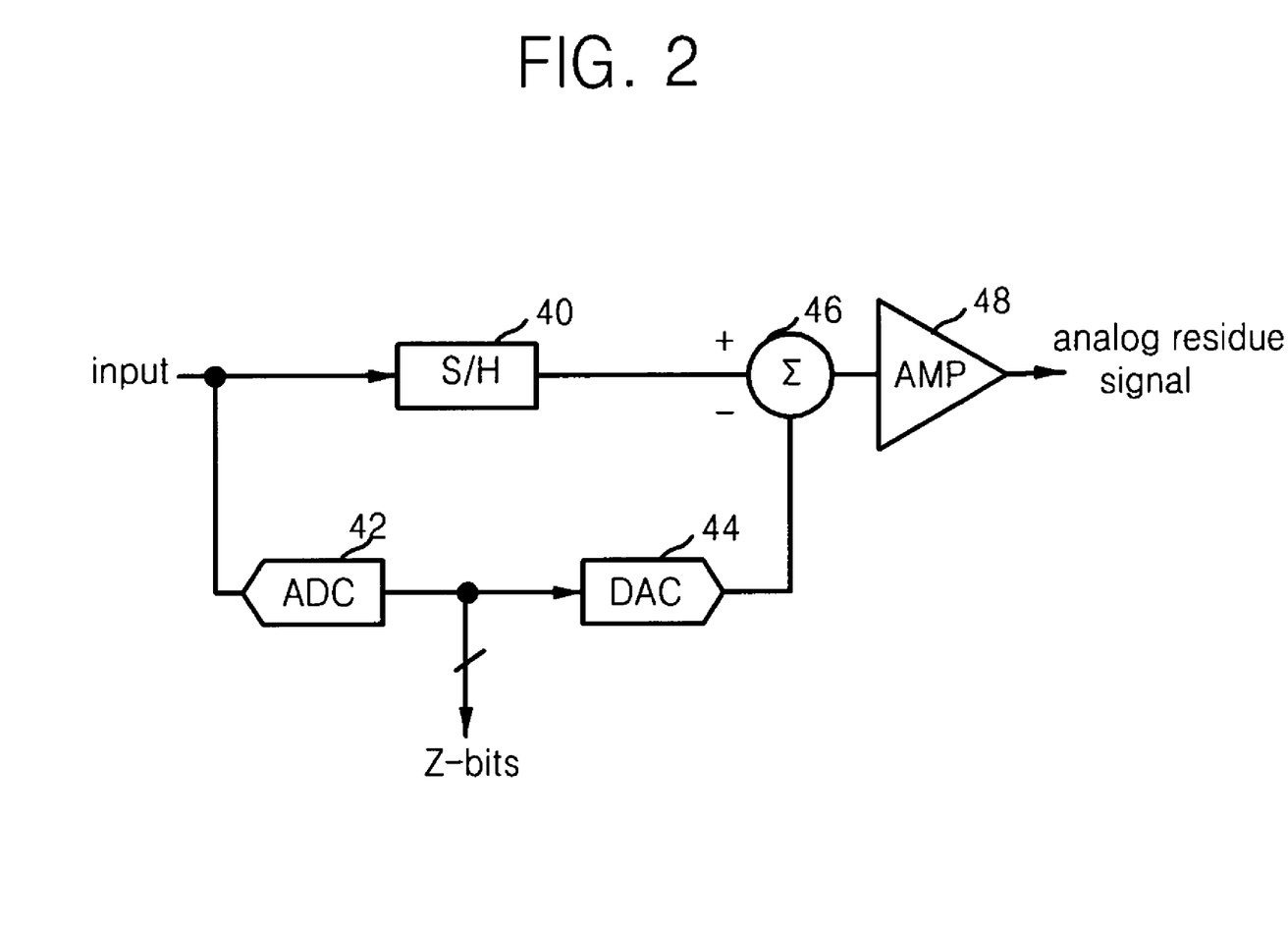
FIG. 2 shows a block diagram for an example stage in FIG. 1, according to an embodiment of the present invention.

FIG. 2 shows a block diagram for an example one of the stages 18a, 18b, 18m, 22a, 22b, 22m, 26a, 26b, and 26m. The example stage in FIG. 2 includes an analog to digital converter (ADC) 42, a digital to analog converter (DAC) 44, a subtractor 46, and an amplifier 48. The stage may further include a sample/hold circuit 40 (or, a sample/hold amplifier 40).

The ADC 42 converts an analog signal from a respective selection unit to a digital signal of Z-bits. The DAC 44 converts the digital signal of Z-bits from the ADC 42 to an approximation analog signal. The subtractor 46 generates an output analog signal by subtracting such an approximation analog signal from the analog signal of the selection unit or a hold signal from the sample/hold circuit 40. The amplifier 48 generates an analog signal which is an analog residue signal in FIG. 2 by amplifying the output from the subtractor 46.

Figure 6:
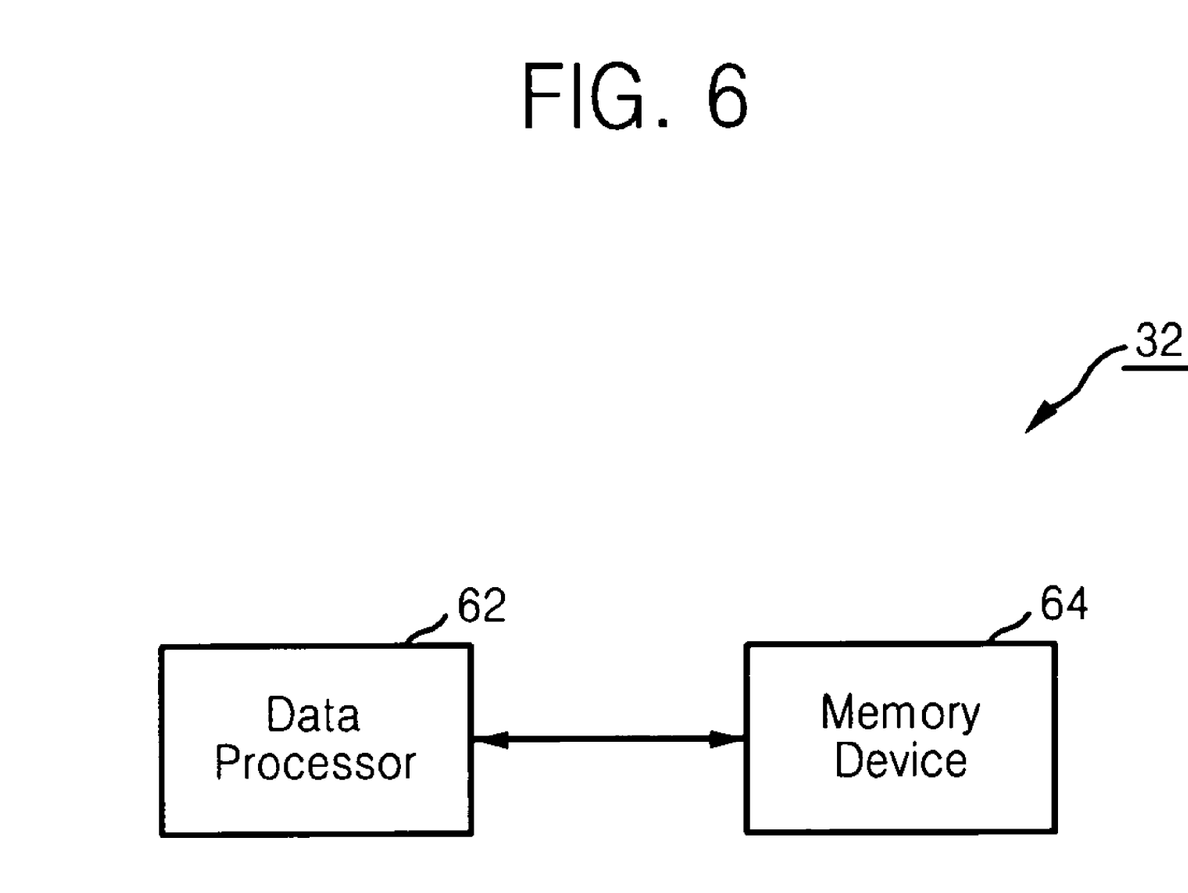
FIG. 6 shows a block diagram of a decision unit in FIGS. 1, 3, 4, and 5 according to an embodiment of the present invention.
Figure 7:
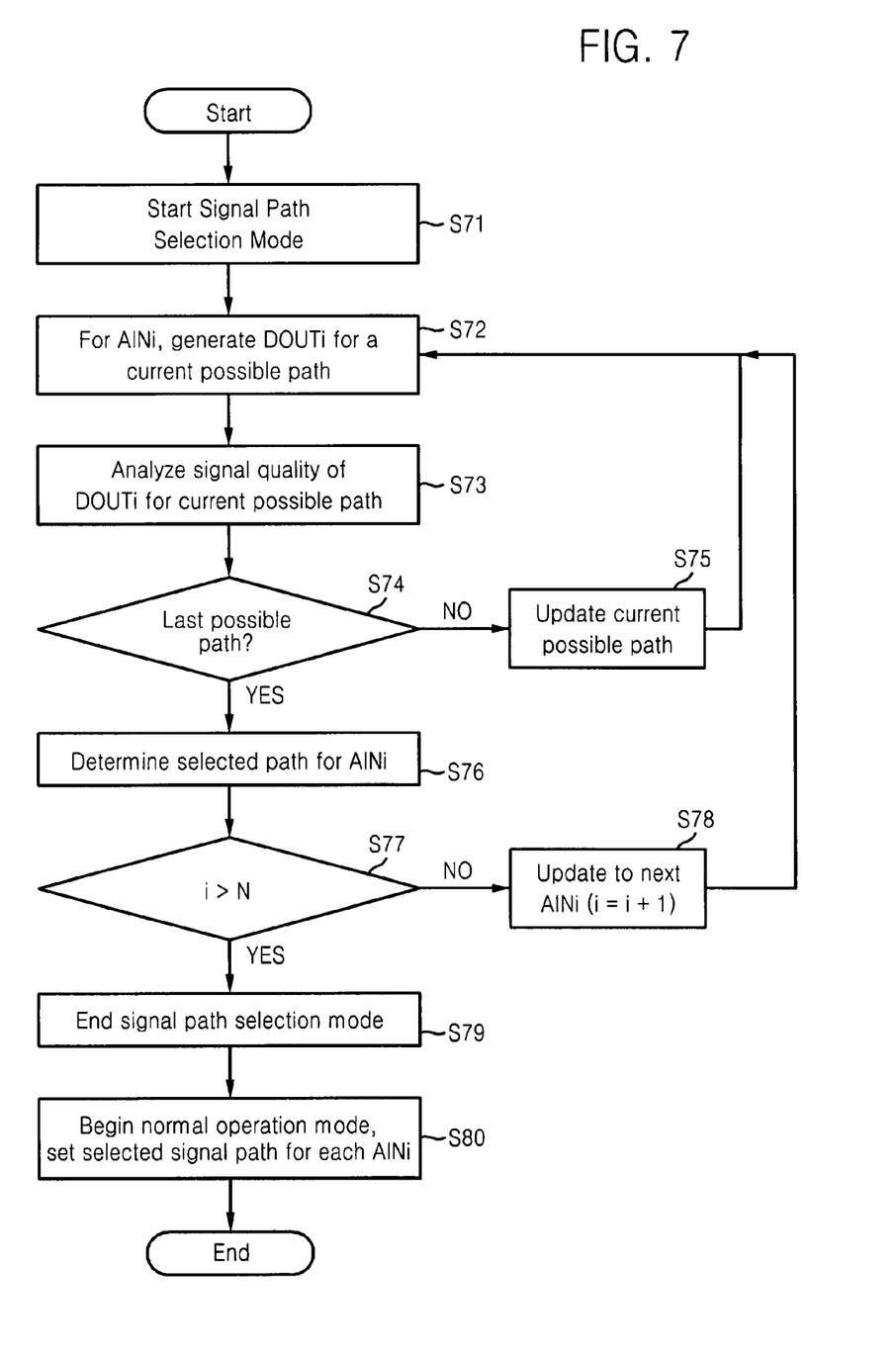
FIG. 7 shows a flow-chart of steps during operation of the multi-channel pipelined analog to digital converter of FIG. 1, according to an embodiment of the present invention.

Referring to FIG. 6, the decision unit 32 includes a data processor 62 and a memory device 64 having sequences of instructions (i.e., software) stored thereon, in an example embodiment of the present invention. Execution of such sequences of instructions by the data processor 62 causes the data processor to perform any steps of operation attributed to the decision unit 32 described in reference to the flow-chart of FIG. 7. FIG. 7 shows a flow-chart of steps during operation of the multi-channel pipelined analog to digital converter of FIG. 1, according to an embodiment of the present invention.

Referring to FIGS. 1, 2, and 7, the signal path selection mode is started (step S71 in FIG. 7) with the decision unit 32 controlling the selection signal generation unit 34 to generate control signals that in turn control each of the input selection units 12a, 12b, ..., and 12m to output the analog test signal TAIN. During the signal path selection mode, a respective signal path is determined for each of the analog input signals AIN1, AIN2, ..., and AINm. For example, such signal paths are for desired performance characteristics of the signal conversion of such signals AIN1, AIN2, ..., and AINm.

Referring back to FIGS. 1 and 7, for a current analog input signal AINi of the analog input signals AIN1, AIN2, ..., and AINm, the decision unit 32 controls the selection signal generation unit 34 to generate the selection control signals for determining a possible path for the current analog input signal AIN1 through one of the first stages 18a, 18b, ..., and 18m, through one of the second stages 22a, 22b, and 22m, and so on through one of the n-th stages 26a, 26b, and 26m.

For example, for the first analog input signal AIN1, the input selection unit 12a outputs the analog test signal TAIN that is sampled and held by the sample/hold amplifier 14a. Then, a possible path for AIN1 is selected through one of the first stages 18a, 18b, ..., and 18m, through one of the second stages 22a, 22b, and 22m, and so on through one of the n-th stages 26a, 26b, and 26m.

The digital correction unit 30 is notified by the decision unit 32 of the current possible path for AINi. The respective digital signals and at least one of the respective analog residue signals from such a possible path is used by the digital correction unit 30 to generate a corresponding converted digital output signal DOUTi for the AINi (step S72 in FIG. 7), and the decision unit 32 analyzes such a signal DOUTi (step S73 of FIG. 7). A respective DOUTi is generated for each possible path for AINi by updating to another possible path (step S75 of FIG. 7) and repeating steps S72 and S73 until the last possible path has been processed (step S74 of FIG. 7).

The data processor 62 analyzes the respective DOUTi signal from the digital correction unit 30 for each possible path for AINi to determine a selected path for AINi that results in best performance characteristics of signal conversion for AINi. For example, the decision unit 32 analyzes the respective DOUTi for each possible path of AINi for at least one of signal to noise pulse distortion rate (SNDR), spurious-free dynamic range (SFDR), or effective number of bits (ENOB) through a fast Fourier conversion test. Additionally, the decision unit 32 analyzes the respective DOUTi for each possible path of AINi for at least one of differential nonlinearity (DNL) or integral non-linearity (INL) through a code density test.

The decision unit 32 determines a selected path for the current analog input signal AINi by determining the path that has desired performance characteristics (step S76 of FIG. 7). Such steps S72, S73, S74, S75, and S76 are repeated with an update to another analog input signal (step S78) until a respective selected path for best possible conversion performance is determined for each of the analog input signals ANI1, ANI2, ..., and ANIm (step S77 of FIG. 7) at which point the signal path selection mode ends (step S79 of FIG. 7).

The normal operation mode then begins (step S80 of FIG. 7) with the respective selected path being set for each of the analog input signals ANI1, ANI2, ..., and ANIm. In that case, the decision unit 32 controls the selection signal generation unit 34 to generate selection control signals for setting the respective selected path for each of the analog input signals ANI1, ANI2, ..., and ANIm.

With the respective selected path set for each of the analog input signals ANI1, ANI2, ..., and ANIm, the digital correction unit 30 is notified of the selected path and receives the respective digital signals and at least one of the respective analog residue signals from the respective selected path. The digital correction unit 30 determines a respective converted digital output signal DOUTi by performing time alignment and digital calibration on such received signals, for each of the analog input signals ANI1, ANI2, ..., and ANIm.

Figure 3:
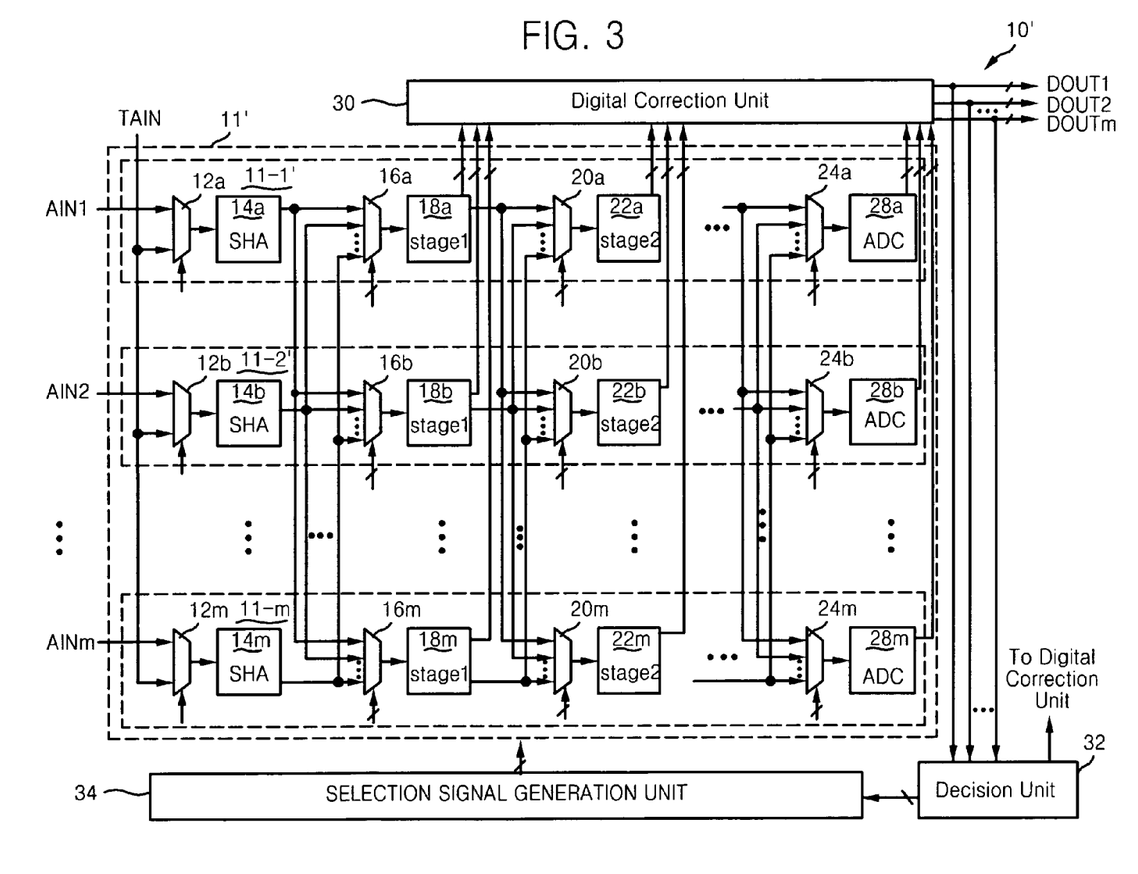
FIG. 3 shows a block diagram of a multi-channel pipelined analog to digital converter with flash analog-to-digital converters according to another embodiment of the present invention.

FIG. 3 shows a block diagram of a multi-channel pipelined analog to digital converter 10' according to another embodiment of the present invention. Elements having the same reference number in FIGS. 1 and 3 refer to elements having similar structure and/or function.

However, comparing FIGS. 1 and 3, the last stages 26a, 26b, ..., and 26m in FIG. 1 are replaced in FIG. 3 with ADCs (analog-to-digital converters) 28a, 28b, ..., and 28m, respectively in forming a plurality of pipelined ADCs 11-1', 11-2', ..., and 11-m' in a core 11' of a semiconductor integrated circuit system. Each of the ADCs 28a, 28b, ..., and 28m is a respective multi-bit flash ADC (analog-to-digital converter) in one embodiment of the present invention, but are not restricted thereto.

Digital signals output from the stages 18a, 18b, ..., and 18m, 22a, 22b, and 22m and from the ADC converters 28a, 28b, ..., and 28m are output to the digital correction unit 30. The digital correction unit 30 generates the digital converted output signals DOUT1, DOUT2, ..., and DOUTm using such digital signals.

Alternatively, each of the pipelined ADCs 11-1, 11-2, ..., and 11-m of FIG. 1 may further include a respective multi-bit flash ADC (not shown). In that case, each such multi-bit flash ADC generates a digital signal for the digital correction unit 30 from a respective analog signal output from a respective one of the n-th pipeline stage 26a, 26b, ..., and 26m. Also in that case, the digital correction unit 30 generates the digital converted output signals DOUT1, DOUT2 through DOUTm using such digital signals from the multi-bit flash ADCs and the stages 18a, 18b, and 18m, 22a, 22b . . . , and 22m, and 26a, 26b, . . . , and 26m.

Figure 4:
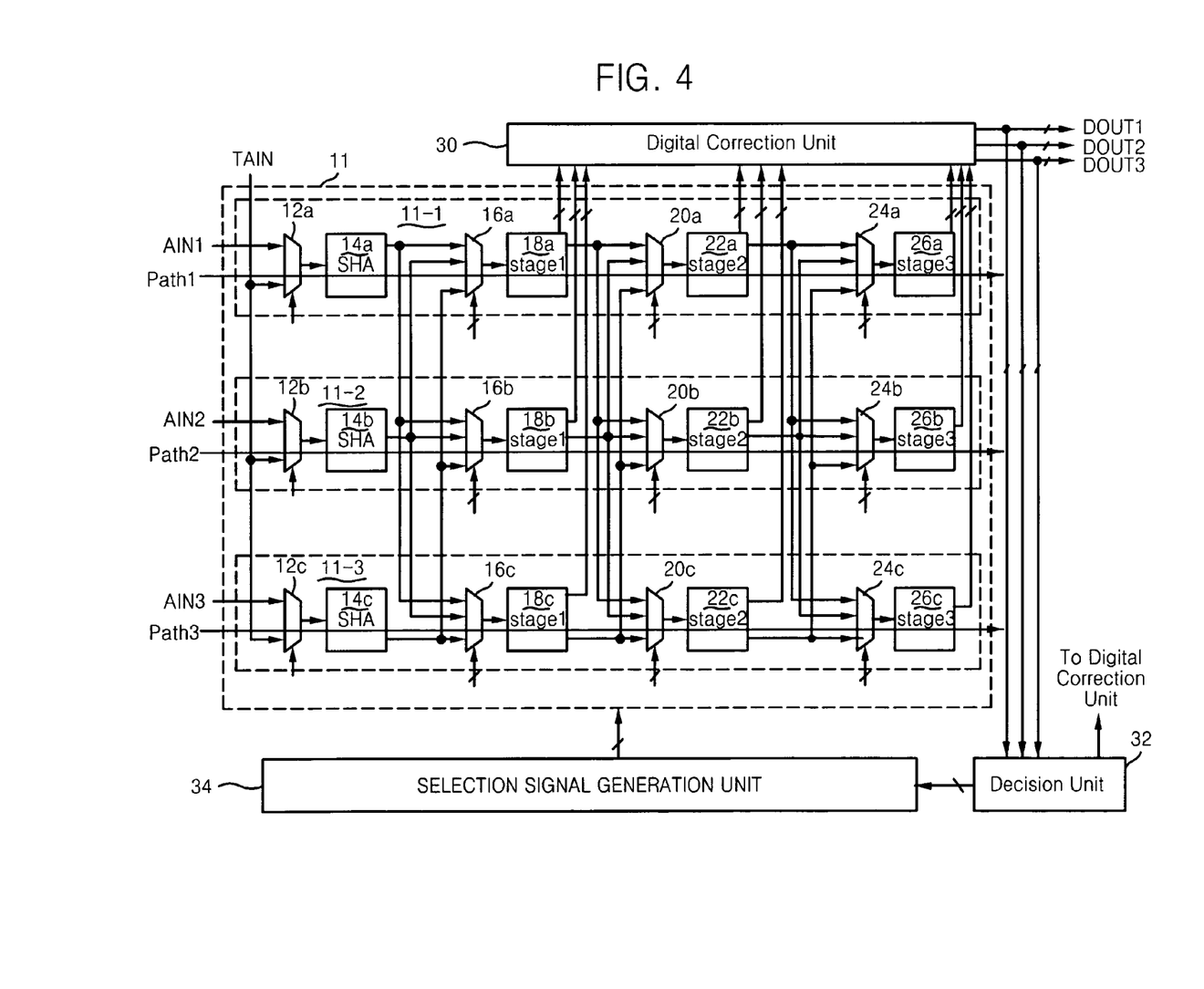
FIG. 4 shows example selected signal paths for three input signals in a 3-channel 3-stage pipelined analog to digital converter, according to one embodiment of the present invention.

FIG. 4 illustrates example selected paths for three analog input signals AIN1, AIN2, and AIN3 in a 3-channel 3-stage pipelined analog to digital converter. Referring to FIG. 4, the decision unit 32 controls the selection signal generation unit 34 to generate selection control signals to the selection units 12a, 12b, 12c, 16a, 16b, 16c, 20a, 20b, 20c, 24a, 24b, and 24c for setting such paths during the normal operation mode. In an aspect of the present invention, selected paths (Path1, Path2, and Path3) for the analog input signals AIN1, AIN2, and AIN3 are through mutually exclusive components.

With such selection control signals in FIG. 4, a first selected path (Path1) through components 12a, 14a, 16a, 18a, 20a, 22a, 24a, and 26a is formed for the first analog input signal AIN1. The decision unit 32 determined such a selected path (Path1) for the first analog input signal AIN1 during the prior signal path selection mode according to the process of FIG. 7 for example. The digital correction circuit 30 receives the digital signals and at least one of the analog residue signals generated from such components in the first selected path (Path1) to determine a first digital converted output DOUT1 for the first analog input signal AIN1.

Also with such selection control signals in FIG. 4, a second selected path (Path2) through components 12b, 14b, 16b, 18b, 20b, 22b, 24b, and 26b is formed for the second analog input signal AIN2. The decision unit 32 determined such a selected path (Path2) for the second analog input signal AIN2 during the signal path selection mode according to the process of FIG. 7 for example. The digital correction circuit 30 receives the digital signals and at least one of the analog residue signals generated from such components in the second selected path (Path2) to determine a second digital converted output DOUT2 for the second analog input signal AIN2.

Further with such selection control signals in FIG. 4, a third selected path (Path3) through components 12c, 14c, 16c, 18c, 20c, 22c, 24c, and 26c is formed for the third analog input signal AIN3. The decision unit 32 determined such a selected path (Path3) for the third analog input signal AIN3 during the signal path selection mode according to the process of FIG. 7 for example. The digital correction circuit 30 receives the digital signals and at least one of the analog residue signals generated from such components in the third selected path (Path3) to determine a third digital converted output DOUT3 for the third analog input signal AIN3.

Figure 5:
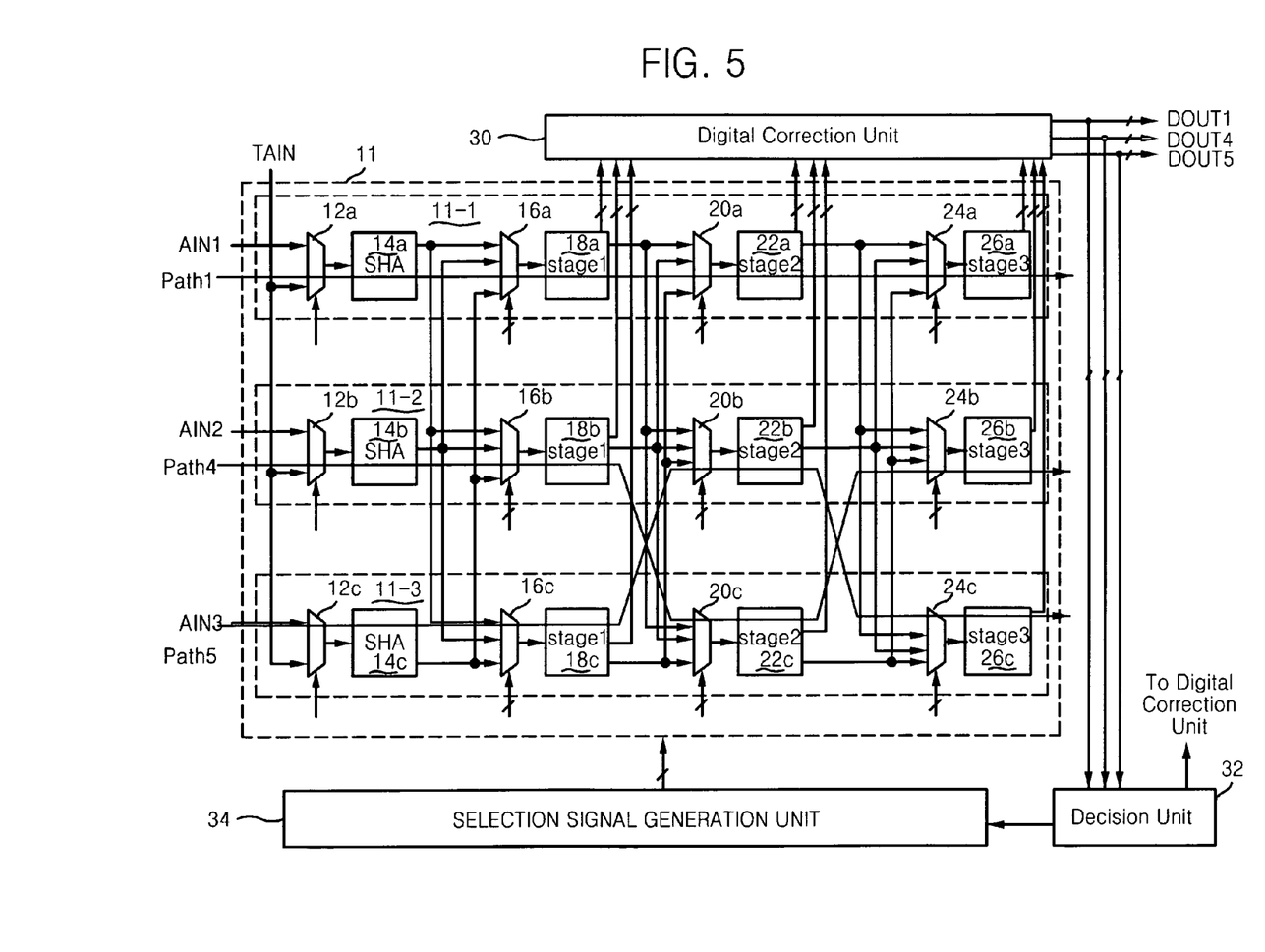
FIG. 5 shows another example of selected signal paths for three input signals in a 3-channel 3-stage pipelined analog to digital converter, according to one embodiment of the present invention.

FIG. 5 illustrates another example of selected paths for three analog input signals AIN1, AIN2, and AIN3 in a 3-channel 3-stage pipelined analog to digital converter. Referring to FIG. 5, the decision unit 32 controls the selection signal generation unit 34 to generate selection control signals to the selection units 12a, 12b, 12c, 16a, 16b, 16c, 20a, 20b, 20c, 24a, 24b, and 24c for setting such paths during the normal operation mode. In an aspect of the present invention, selected paths (Path1, Path4, and Path5) for the analog input signals AIN1, AIN2, and AIN3 are through mutually exclusive components.

With such selection control signals in FIG. 5, the first selected path (Path1) through components 12a, 14a, 16a, 18a, 20a, 22a, 24a, and 26a is formed for the first analog input signal AIN1. The decision unit 32 determined such a selected path (Path1) for the first analog input signal AIN1 during the prior signal path selection mode according to the process of FIG. 7 for example. The digital correction circuit 30 receives the digital signals and at least one of the analog residue signals generated from such components in the first selected path (Path1) to determine a first digital converted output DOUT1 for the first analog input signal AIN1.

Also with such selection control signals in FIG. 5, a fourth selected path (Path4) through components 12b, 14b, 16b, 18b, 20c, 22c, 24b, and 26b is formed for the second analog input signal AIN2. The decision unit 32 determined such a selected path (Path4) for the second analog input signal AIN2 during the signal path selection mode according to the process of FIG. 7 for example. The digital correction circuit 30 receives the digital signals and at least one of the analog residue signals generated from such components in the fourth selected path (Path4) to determine a corresponding digital converted output DOUT4 for the second analog input signal AIN2.

Further with such selection control signals in FIG. 5, a fifth selected path (Path5) through components 12c, 14c, 16c, 18c, 20b, 22b, 24c, and 26c is formed for the third analog input signal AIN3. The decision unit 32 determined such a selected path (Path5) for the third analog input signal AIN3 during the signal path selection mode according to the process of FIG. 7 for example. The digital correction circuit 30 receives the digital signals and at least one of the analog residue signals generated from such components in the fifth selected path (Path5) to determine a corresponding digital converted output DOUT5 for the third analog input signal AIN3.

In this manner, during the signal path selection mode, the respective selected path is determined for each of the analog input signals using an analog test input signal. The analog test input signal may remain the same or may be changed during the determination of the respective selected path for each of the analog input signals. The respective selected path is determined for desired performance characteristics for each of the analog input signals to minimize adverse effects of variation in manufacturing process, voltage, and/or temperature While the example embodiments of the present invention and their advantages have been described in detail, it should be understood that various changes, substitutions and alterations may be made herein without departing from the scope of the invention. For example, pipelined ADCs are described herein, but the present invention may also be practiced with the stage cells connected in a pipeline style or a cascade style with analog amplifiers or operational amplifiers or buffers.

The multi-channel pipelined ADC according to embodiments of the present invention may be used in a CMOS image sensor or may be applied in a time-interleaved ADC. In addition, when any of the cores 11 and 11' of the present invention is applied to a system including a plurality of functional blocks performing functions in parallel, performance variance among the plurality of the functional blocks may be eliminated.

The present invention is limited only as defined in the following claims and equivalents thereof.

What is claimed is:

1. A signal converter comprising:
a plurality of pipelined signal converters, each having a respective plurality of stage cells coupled in series; and
a decision unit for determining a respective selected path through the stage cells of the plurality of pipelined signal converters for each of a plurality of input signals during a signal path selection mode;
wherein each of the pipelined signal converters includes:
a respective input selection unit controlled by the decision unit to output a test signal during the signal path selection mode and to output a respective input signal during a normal operation mode, to first stage cells of the pipelined signal converters.

2. The signal converter of claim 1, wherein each of the pipelined signal converters further includes:
a respective sample and hold unit for sampling a respective output of the respective input selection unit to generate a respective sampled input signal to the first stage cells of the pipelined signal converters.

3. The signal converter of claim 1, wherein each of the stage cells includes:
a respective selection unit controlled by the decision unit to output a selected one of a plurality of outputs from a previous stage of the pipelined signal converters; and
a respective stage that generates a respective digital signal and a respective analog signal from the output of the respective stage selection unit.

4. The signal converter of claim 3, wherein the decision unit controls the respective selection units for setting the respective selected path for each of the input signals during a normal operation mode after the signal path selection mode.

5. The signal converter of claim 3, wherein a respective last stage includes a respective flash analog-to-digital converter in each of the plurality of pipelined signal converters.

6. The signal converter of claim 3, further comprising:
a selection signal generation unit for generating control signals to the respective selection units.

7. The signal converter of claim 3, further comprising:
a digital correction unit for generating a respective converted output signal from the respective digital signals and at least one of the respective analog signals in the respective selected path for each of the plurality of input signals.

8. The signal converter of claim 1, wherein the decision unit includes:
a data processor; and
a memory device having sequences of instructions stored thereon, wherein execution of the sequences of instructions by the data processor causes the data processor to perform the step of:
analyzing performance characteristics of a respective converted signal for each of a respective plurality of possible signal paths for determining the respective selected path of each input signal.

9. A signal converter comprising:
a plurality of pipelined signal converters, each having a respective plurality of stage cells coupled in series, with each stage cell having a respective selection unit and a respective stage;
a selection signal generation unit for generating control signals that control the respective selection units for defining a respective selected path through the respective stages in the plurality of pipelined signal converters for each of a plurality of input signals; and
a decision unit for analyzing performance characteristics of a respective converted output signal for each of a respective plurality of possible signal paths for determining the respective selected path of each input signal during a signal path selection mode.

10. The signal converter of claim 9, wherein the respective selected path for each of the input signals is set during a normal operation mode after the signal path selection mode.

11. A method of signal conversion, comprising:
generating a respective converted output signal for each of a plurality of input signals through a plurality of pipelined signal converters, each having a respective plurality of stage cells coupled in series;
determining a respective selected path through the stage cells of the plurality of pipelined signal converters for each of the input signals during a signal path selection mode; and
controlling a respective input selection unit to output a test signal during the signal path selection mode and to output a respective input signal during a normal operation mode, to first stage cells of the pipelined signal converters.

12. The method of claim 11, further comprising:
sampling and holding a respective output of the respective input selection unit to generate a respective sampled input signal to the first stage cells of the pipelined signal converters.

13. The method of claim 11, further comprising:
controlling a respective selection unit of each stage cell to output a selected one of a plurality of outputs from a previous stage of the pipelined signal converters; and
generating a respective digital signal and a respective analog signal from the output of the respective stage selection unit.

14. The method of claim 13, further comprising:
controlling the respective stage selection units for setting the respective selected path for each of the input signals during a normal operation mode after the signal path selection mode.

15. The method of claim 13, wherein a respective last stage is a respective flash analog-to-digital converter in each of the plurality of pipelined signal converters.

16. The method of claim 13, further comprising:
generating a respective converted output signal from the respective digital signals and at least one of the respective analog signals in the respective selected path for each input signal.

17. The method of claim 13, further comprising:
analyzing performance characteristics of a respective converted signal for each of a respective plurality of possible signal paths for determining the respective selected path of each input signal.

* * * * *